United States Patent [19]

Watanabe et al.

[11] Patent Number: 4,612,167

[45] Date of Patent: Sep. 16, 1986

[54] COPPER-BASE ALLOYS FOR LEADFRAMES

[75] Inventors: Rikizo Watanabe, Yasugi; Daizi Sakamoto, Yonago, both of Japan

[73] Assignee: Hitachi Metals, Ltd., Tokyo, Japan

[21] Appl. No.: 707,206

[22] Filed: Mar. 1, 1985

[30] Foreign Application Priority Data

| Mar. 2, 1984 | [JP] | Japan | 59-38616 |
| Dec. 28, 1984 | [JP] | Japan | 59-279859 |
| Dec. 28, 1984 | [JP] | Japan | 59-279860 |
| Dec. 28, 1984 | [JP] | Japan | 59-279861 |

[51] Int. Cl.⁴ .................................. C22C 9/06
[52] U.S. Cl. .................. 420/471; 420/473; 420/476; 420/481; 420/484; 420/485; 420/486; 420/487; 420/488; 420/492
[58] Field of Search ........... 420/473, 471, 476, 479, 420/481, 484, 485–488, 492; 148/411–414, 432–436, 11.5 C, 12.7 C, 160

[56] References Cited

U.S. PATENT DOCUMENTS 2,752,242  6/1956  Holzwarth ..................... 420/488
4,366,117  12/1982  Tsuji ............................. 420/481

FOREIGN PATENT DOCUMENTS

| 47207 | 11/1972 | Japan | 420/471 |
| 53228 | 5/1975 | Japan | 420/488 |
| 23885 | 8/1979 | Japan | 420/471 |
| 1582428 | 1/1981 | United Kingdom | 420/486 |
| 404589 | 3/1974 | U.S.S.R. | 420/486 |

Primary Examiner—L. Dewayne Rutledge
Assistant Examiner—Robert L. McDowell
Attorney, Agent, or Firm—Birch, Stewart, Kolasch & Birch

[57] ABSTRACT

A copper-base alloy for leadframes comprising 0.8–4.0 weight % of Ni, 0.2–4.0 weight % of Ti, and balance Cu and inevitable impurities, the ratio of Ni to Ti being 1–4. It may also comprise 0.1–2.0 weight % of Zn. It may further comprise 0.01–2.0 weight % of at least one of Fe and Co and 0.005–0.5 weight % of at least one element selected from the group consisting of Al, Si, Mn and Mg. The copper-base alloy has good electric conductivity and high mechanical strength. It further has good solderability and solder durability.

8 Claims, 4 Drawing Figures

COPPER-BASE ALLOYS FOR LEADFRAMES

BACKGROUND OF THE INVENTION

1. Field of the Invention

The present invention relates to leadframe materials for use in semiconductor devices. More particularly, it relates to copper alloys for leadframes having excellent electric conductivity and mechanical strength.

2. Description of the Prior Art

Semiconductor chips having integrated circuits are usually connected to leadframes by means of wires, and they are packaged in molded resins except for leadframe terminals, whereby IC devices are provided. Leadframe materials which may be used for such integrated circuit devices are, in general, required to have the following properties:

(1) Good electric and thermal conductivities

Since leadframes serve as electric conductors for supplying electric signals to the circuits, they should have good electric conductivity. Also, since heat generated in the circuits should be dissipated through the leadframes, they should have good thermal conductivity, too. In general, thermal conductivity is proportional to electric conductivity.

(2) High mechanical strength

When the leadframe terminals of semiconductor devices are inserted into sockets of circuit boards, misalignments of the terminals and the sockets may occur. Accordingly, the leadframe terminals should be tough enough not to be bent when pressed under misaligned conditions. Further, they should have high resistance to fatigue by repeated bending.

(3) Good heat resistance (high softening point)

During the production of semiconductor devices, die bonding, wire bonding and resin molding are performed, exposing leadframes to high temperatures of 300°-450° C. If the leadframes are largely softened by exposure to such temperatures, they would be deformed even by small force at room temperature. This is detrimental to the leadframes. Accordingly, leadframes must have good heat resistance, namely high softening temperature so that they have enough resistance to mechanical deformation at room temperature.

(4) Coefficient of thermal expansion close to those of semiconductor chips or molded resin packages If there is large difference in coefficient of thermal expansion between leadframes and semiconductor chips or molded resin packages, distortions would occur during the assembling steps involving heating, due to the difference in their thermal expansion coefficients. Such distortions might cause the variations of semiconductor chips' characteristics and the deteriorations of the adhesion of the leadframes to resin packages. In order to prevent this, the leadframes should have thermal expansion coefficients close to those of the semiconductor chips or the molded resin packages.

(5) Good platability

Leadframes are plated with gold or silver in portions which are subjected to die bonding with the semiconductor chips. Therefore, leadframes should have good affinity to platings. That is, platings should be strongly adhered to the leadframe surfaces and should have as small defects as possible.

(6) Good solderability

Leadframe terminals are soldered before or after mounting thereof on circuit boards. Accordingly, leadframes should have good solderability, namely they should be highly wettable with solders.

(7) Good solder durability

Semiconductor devices soldered on circuit boards should not deteriorate their characteristics during their entire life. In general, soldered portions are one of those vulnerable to deterioration. Therefore, the soldered portions of the leadframes should be able to withstand any possible environment in which semiconductor devices are used, without deteriorating the adhesion thereof to solder layers. Such property is called herein "solder durability."

(8) Good adhesion to molded resin packages

In general, most semiconductor integrated circuit devices are packaged with molded resins. Accordingly, leadframes are required to have good adhesion to molded resins.

Typical alloys for leadframes are iron-nickel alloys and copper-base alloys. As iron-nickel alloys, Fe-42% Ni alloys and Fe-29% Ni-17% Co alloys are known. These alloys have excellent mechanical strength, but their electric conductivity is not always satisfactory. On the other hand, copper-base alloys have good electric conductivity, and are much less expensive than the iron-nickel counterparts. Particularly from the economic point of view, the copper-base alloys have recently been finding rapidly increasing use in leadframes.

U.S. Pat. No. 4,249,941 to R. Futatsuka, et al. discloses copper-base alloys for leadframes of integrated circuit devices consisting essentially of 0.5–1.5 weight % Fe, 0.5–1.5 weight % Sn, 0.01–0.35 weight % P and balance Cu and inevitable impurities. They are, however, not necessarily satisfactory in terms of mechanical strength and solder durability.

U.S. Pat. No. 4,337,089 to K. Arita, et al. discloses copper-nickel-tin alloys for leadframes containing 0.5–3.0 weight % Ni, 0.3–0.9 weight % Sn, 0.01–0.2 weight % P, 0–0.35 weight % Mn and/or Si, and balance Cu. These alloys have good tensile strength but relatively poor electric conductivity. In addition, they do not have sufficient solder durability.

There are some other copper-base alloys: Copper Alloy C 194 (2.35% Fe-0.03% P-0.12% Zn), Copper Alloy C 195 (1.5% Fe-0.1% P-0.8% Co-0.6% Sn), Copper Alloy C 155 (0.06% P-0.07% Ag-0.11% Mg) and Copper Alloy C 151 (0.1% Zr). See "Leadframe Materials for Packaging Semiconductors," *SEMICONDUCTOR INTERNATIONAL,* September 1982, pp. 111-124. These copper-base alloys, however, do not necessarily have a preferable combination of good electric conductivity and high mechanical strength. Further, they are not satisfactory in terms of solder durability.

OBJECT AND SUMMARY OF THE INVENTION

An object of the present invention is, therefore, to provide a copper-base alloy for leadframes having a combination of good electric conductivity and high mechanical strength.

Another object of the present invention is to provide a copper-base alloy for leadframes having a combination of good electric conductivity and high mechanical strength as well as good solder durability.

Further object of the present invention is to provide a copper-base alloy satisfying the requirements for leadframe materials as listed above.

In view of the above objects, the inventors have conducted extensive research on the influences of various alloy elements on the properties of copper-base alloys. As a result, they have found that the inclusion of Ni and Ti in a particular ratio provides copper-base alloys having high mechanical strength and electric conductivity. They further have found that the inclusion of zinc as a third alloy element provides copper-base alloys whose adhesion to solder layers is not substantially deteriorated even after a long period of time under severe conditions of high temperatures, e.g., 150° C. In addition, they have found that the inclusion of Sn and/or at least one of Fe and Co enhances the mechanical strength of Cu-Ni-Ti-Zn alloys without substantially deteriorating solderability, and that the further inclusion of Al, Si, Mn or Mg or a mixture thereof can improve the alloys' adhesion to molded resins. Based on these findings, the present invention has been completed.

A copper-base alloy for leadframes according to the present invention comprises 0.8–4.0 weight % of Ni, 0.2–4.0 weight % of Ti, balance Cu and inevitable impurities, the ratio of Ni to Ti being 1–4.

The copper-base alloy for leadframes according to the present invention may further comprise 0.1–2.0 weight % of Zn.

Additional alloy components which may be included in the copper-base alloy according to the present invention are 0.1–2.0 weight % of Sn, 0.01–2.0 weight % of at least one of Fe and Co, and 0.005–0.5 weight % of at least one of Al, Si, Mn and Mg.

DESCRIPTION OF THE PREFERRED EMBODIMENTS

Figure 1:
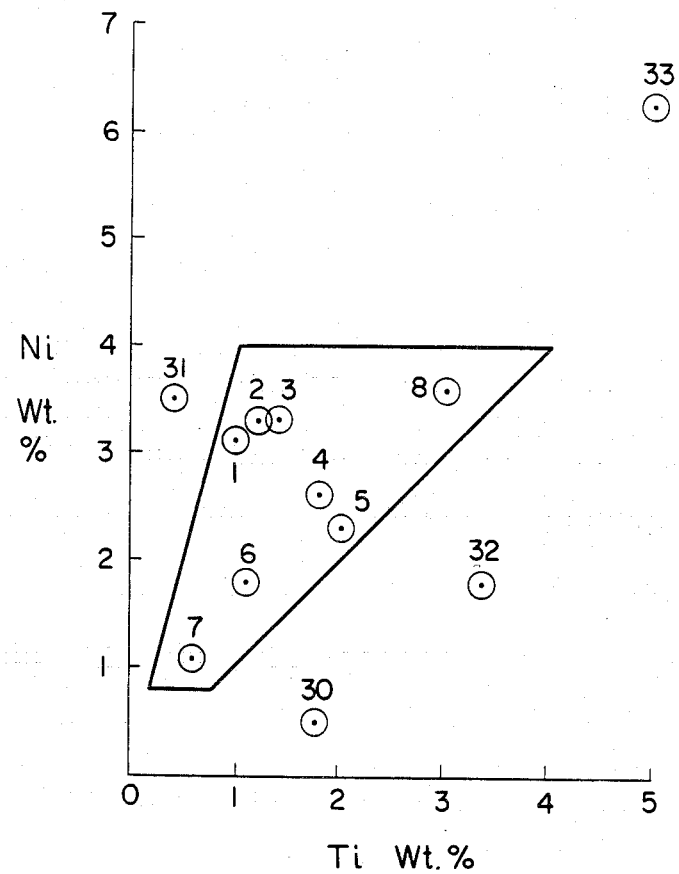
FIG. 1 is a graph showing the amounts of Ni and Ti in the alloys of Example 1.

Ni and Ti, when added to copper, serve to enhance mechanical strength and heat resistance thereof. When Ni is less than 0.8 weight % and when Ti is less than 0.2 weight % sufficient improvement in mechanical strength of the alloy cannot be achieved. On the other hand, when either of Ni and Ti exceeds 4.0 weight %, the workability, platability and solderability of the alloy are deteriorated. Accordingly, Ni should be 0.8–4.0 weight %, and Ti should be 0.2–4.0 weight %. The preferred amounts of Ni and Ti added are 1.0–3.5 weight % and 0.5–2.0 weight %, respectively.

It has been found that Ni and Ti tend to form $Ni_3Ti$ and NiTi intermetallic compounds which precipitate as fine particles in the copper matrix, and that nickel-titanium precipitates do not reduce the electric conductivity of the copper alloy, while uncombined Ni and Ti which form solid solution with the copper matrix may reduce electric conductivity of the copper-base alloy. Therefore, the Ni/Ti ratio should be controlled to ensure that excess Ni or Ti, if any, is as small as possible. When the Ni/Ti ratio by weight is less than 1, Ti remaining uncombined in the alloy is excessive enough to seriously reduce the electric conductivity and solderability of the alloy. On the other hand, when the Ni/Ti ratio exceeds 4, too excessive Ni exists so that the alloy has reduced electric conductivity. In view of the above, the Ni/Ti ratio by weight should be limited to 1–4. The preferred ratio is 1.2–3.5.

Zn is an alloy element for improving the alloy's ability to keeping good adhesion to solder layers for a long period of time. This ability may be called simply "solder durability." Why the solder durability is improved by the addition of Zn has not yet been made clear. It may be presumed, however, that Zn works to prevent Ni or Ti existing in a solid solution state in the copper matrix from moving by diffusion to the base metal surface contacting with the solder layer, thus preventing the formation of intermetallic compounds of Ni or Ti with Sn provided from the solder and incidental elements such as Fe, Co and Si, on the base metal boundary with the solder. When Zn is less than 0.1 weight %, sufficient effect cannot be achieved, and when it is more than 2.0 weight %, the alloy has reduced electric conductivity and low corrosion resistance. Accordingly, Zn should be 0.1–2.0 weight %. The preferred amount of Zn is 0.2–1.8 weight %. Particularly when Zn is 0.2–1.0 weight %, the preferred combination of high electric corductivity, mechanical strength, solderability and solder durability is obtained.

Sn forms solid solution with the copper matrix so that it enhances mechanical strength of the alloy without substantially deteriorating solderability thereof. When Sn is less than 0.1 weight %, sufficient effect cannot be obtained, and when it is more than 2.0 weight %, electric conductivity of the alloy becomes too low. Accordingly, Sn should be 0.1–2.0 weight %. The preferred amount of Sn is 0.2–1.7 weight %.

Fe and Co precipitate as fine particles in the alloy matrix so that they enchance the alloy's mechanical strength without substantially deteriorating solderability. Fe and Co may exist alone or in combination. When the total amount of Fe and Co is lower than 0.01 weight %, sufficient effect cannot be obtained, and when it exceeds 2.0 weight %, the alloy's electric conductivity decreases too much. Accordingly, the amount of Fe and/or Co should be 0.01–2.0 weight %. The preferred amount is 0.1–1.0 weight %.

Al, Si, Mn and Mg contribute to the improvement in the adhesion of leadframes to packaging resins. The reason therefor has not yet been clarified, but it may be presumed that these elements form fine oxide particles on the leadframe surface during the steps of die bonding, wire bonding and packaging semiconductor IC chips with resins, and that such oxide particles have good affinity to the packaging resins. These elements may be used alone or in combination. When Al, Si, Mn and Mg in total are less than 0.005 weight %, substantially no effect of improving the adhesion to resins can be obtained, but when they exceed 0.5 weight %, the solderability of the alloy is drastically deteriorated. Accordingly, the total amount of Al, Si, Mn and Mg used should be 0.005–0.5 weight %. The preferred amount is 0.1–0.5 weight %.

The copper-base alloys of the present invention may be formed into leadframes in a conventional way. Typically, alloy elements are melted together in a furnace at 1200°–1400° C., and cast into ingots of predetermined size. The above steps are preferably carried out in vacuum. The ingots are then hot rolled to reduce their thickness to about 2–5 mm. Before hot rolling, forging may be carried out, if necessary. Oxide scales on the sheet surfaces are removed by grinding. The polished sheets are then subjected to cold rolling. Because cold rolling hardens the alloy sheets, annealing is carried out before each cold rolling step, in order to soften the sheets. By repeating the cold rolling and the annealing, the sheets are made as thin as 0.1–0.5 mm. The reduction ratio of cold rolling may be 50–80 %, and the final cold rolling step has preferably 30–70 % of reduction ratio. The sheets are finally aged at 400°–600 ° C. for one minute–5 hours. The finished sheets are cut into leadframes of the desired shapes by punching.

Leadframes may be partially plated with Ag or Au. Semiconductor chips are bonded onto the leadframes, which is called die bonding. Then, wire bonding is conducted to connect the electrodes of integrated circuits on the semiconductor chips to the predetermined portions of the leadframes. They are packaged with molded resins in such a manner that only leadframe terminals extend outside the resin moldings. The leadframe terminals may be plated with tin or coated with solders.

The present invention will be explained in further detail referring to the following Examples.

EXAMPLE 1

Alloys having the compositions as shown in Table 1 were melted in a high-frequency induction furnace, cast and forged, and then subjected to hot rolling to form 5-mm-thick strips. Each strip was ground to remove oxide scales from surfaces thereof. The strip was then subjected to cold rolling and annealing repeatedley. The reduction rate of the final cold rolling step was 50%, resulting in a 0.25 mm-thick sheet. The sheet was finally subjected to an aging treatment at 450° C. for one hour.

The alloy sheets thus prepared were measured with respect to electric conductivity and tensile strength. The results are shown in Table 1. It is to be noted that Table 1 also includes the data of comparative alloys (Nos. 31–33) and conventional alloys (Nos. 55–52). The comparative alloys mean those alloys which consist of the same kinds of elements as those of the present invention, but do not meet the compositional requirements of the present invention. With respect to the conventional alloys, Alloy No. 50 is disclosed as C 509 in "Furukawa Denko Current Report," Vol. 70, July 1980, pp. 103–113, Alloy No. 51 is disclosed as C 725 in "Denshi Zairyo" (*Electronic Materials*), August 1983, pp. 75–79, and Alloy No. 52 is Nickel Alloy 42 disclosed in "*SEMICONDUCTOR INTERNATIONAL*," September 1982, p. 111.

comparative alloys and the conventional ones are inferior in respect of electric conductivity.

The alloy composition range satisfying the reguirements of the present invention (Ni: 0.8–4.0 wt. %, Ti: 0.2–4.0 wt. % and Ni/Ti; 1–4) is shown in FIG. 1, which includes the compositions of Alloy Nos. 1–8 (present invention) and Nos. 30–33 (comparative examples).

EXAMPLE 2

Figure 3:
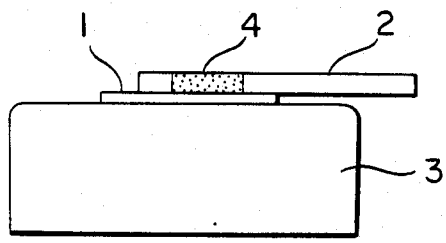
FIG. 3 is a schematic view of an apparatus for measuring the resin adhesion to leadframe alloys.

Alloys of the compositions as shown in Table 2 were formed into 0.25-mm-thick sheets in the same manner as in Example 1. With respect to each alloy sheet, solderability, solder durability and resin adhesion were measured. Specifically speaking, the solderability was measured by dipping a sample sheet of 0.25 mm in thickness, 20 mm in width and 30 mm in length in a molten 60Sn-40Pb solder according to MIL-STD-202F METHOD 208D, and observing whether or not the sample sheet was covered at least 95% by a continuous solder coating. The solder durability was determined by keeping a sample sheet soldered according to the above method in an atmosphere of 150° C. for 500 hours, bending it at a radius of curvature of 2 mm, stretching it straight and observing whether or not the solder was peeled from the leadframe surface. Finally, the evaluation of the resin adhesion was conducted according to the following method consisting of the steps of:

(a) preparing a sample sheet of 0.25 mm×25 mm×25 mm;

(b) heating the sample sheet at 350° C. for two minutes;

(c) cooling it to room temperature;

(d) placing a metal mold 2 having an opening of 10 mm in diameter on the sheet 1, and filling up the opening of the mold 2 with epoxy resin powder 4 as shown in FIG. 3;

(e) holding the sheet 1 on a plate heater 3 heated at 170° C. for two minutes to cause the curing of the resin;

(f) cooling the sheet 1 to room temperature; and (g) pulling the sheet 1 and the mold 2 in parallel to measure the resistance of the resin to being peeled from the sample sheet, which is called "shear peeling strength." The above method simulated the real process of producing resin-packaged semiconductor devices. Therefore, the step (b) was inserted to have the sample sheet experience heating at 350° C. which was

TABLE 1

| No. | Composition (wt. %) | | | | | | Conductivity Ni/Ti | Electric Tensile Strength (% IACS*) | (kgf/mm$^2$) |
|---|---|---|---|---|---|---|---|---|---|
|  | Ni | Ti | Sn | P | Fe | Cu |  |  |  |
| 1 | 3.1 | 1.0 | — | — | — | Bal | 3.1 | 51 | 58 |
| 2 | 3.3 | 1.2 | — | — | — | " | 2.8 | 57 | 57 |
| 3 | 3.3 | 1.4 | — | — | — | " | 2.4 | 51 | 59 |
| 4 | 2.6 | 1.8 | — | — | — | " | 1.4 | 48 | 61 |
| 5 | 2.3 | 2.0 | — | — | — | " | 1.2 | 44 | 63 |
| 6 | 1.8 | 1.1 | — | — | — | " | 1.6 | 49 | 56 |
| 7 | 1.1 | 0.6 | — | — | — | " | 1.8 | 51 | 53 |
| 8 | 3.6 | 3.0 | — | — | — | " | 1.2 | 35 | 65 |
| 30 | 0.5 | 1.8 | — | — | — | " | 0.3 | 20 | 64 |
| 31 | 3.5 | 0.4 | — | — | — | " | 8.8 | 23 | 37 |
| 32 | 1.8 | 3.4 | — | — | — | " | 0.5 | 24 | 69 |
| 33 | 6.3 | 5.0 | — | — | — | " | 1.3 | 27 | 71 |
| 50 | — | — | 4.00 | 0.20 | — | " | — | 20 | 60 |
| 51 | 9.0 | — | 2.30 | — | — | " | — | 12 | 56 |
| 52 | 41 | — | — | — | Bal | — | — | 3 | 65 |

*Note: International Annealed Copper Standard

Table 1 shows that the copper-base alloys according to the present invention have a combination of good electric conductivity and tensile strength while the substantially identical with a wire bonding temperature.

Figure 2A:
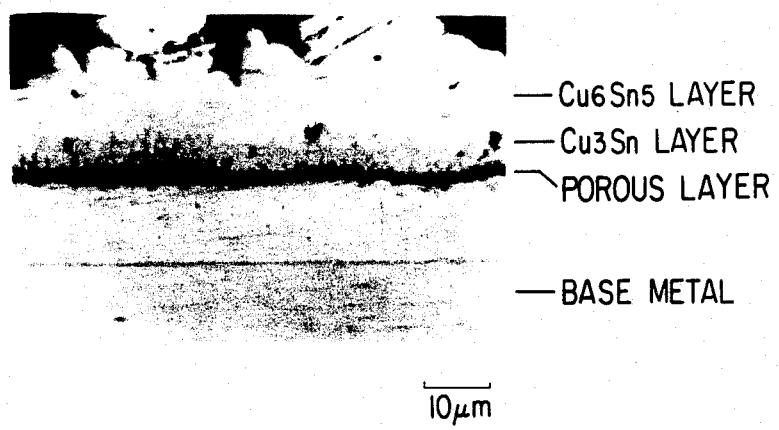
FIGS. 2(a) and 2(b) are photomicrographs of the cross-sections of alloys soldered and subjected to a solder durability test.
Figure 2B:
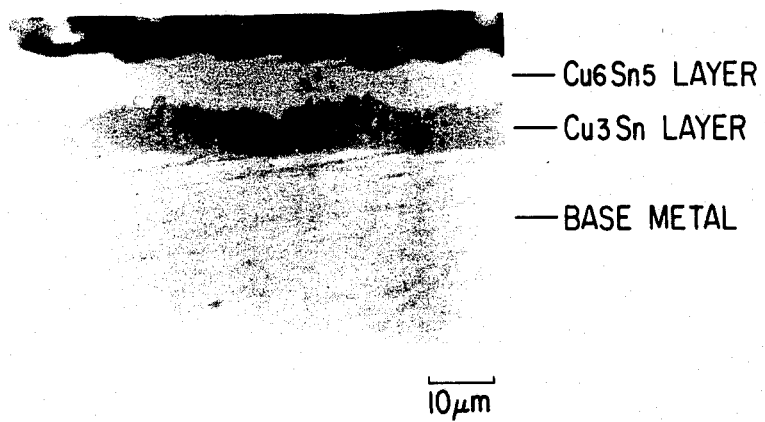

Table 2 shows that the copper-base alloys comprising Ni, Ti and Zn according to the present invention (Nos. 9-24) have high electric conductivity of more than 30% IACS and tensile strength of about 50 kgf/mm$^2$ or more, and good solderability and resin adhesion and further highly improved solder durability.

portions thereof. The photomicrographs as shown in FIGS. 2(a) and 2(b) were 1000 times in magnification. Since the soldered alloys were kept at 150° C. for 500 hours, Cu in the alloys appeared to have diffused into the solders, thereby causing the reaction of Sn with Cu in the alloys to form intermetallic compounds such as $Cu_3Sn$, $Cu_6Sn_5$, etc. on the solder-base metal boundary. In the case of Alloy No. 6 containing no zinc, a porous

TABLE 2

| No. | Ni | Ti | Zn | Sn | Fe | Co | Al | Si | Mn | Mg | P | Cu | Ni/Ti | Electric Conductivity (% IACS) | Tensile Strength (kgf/mm$^2$) | Solderability | Solder Durability | Resin Adhesion (kgf/cm$^2$) |
|---|---|---|---|---|---|---|---|---|---|---|---|---|---|---|---|---|---|---|
| 9 | 2.8 | 1.5 | 0.30 | — | — | — | — | — | — | — | — | Bal | 1.9 | 49 | 58 | Good | Not Separated | 2.5 |
| 10 | 2.9 | 0.9 | 0.49 | — | — | — | — | — | — | — | — | " | 3.2 | 53 | 57 | " | Not Separated | 2.5 |
| 11 | 3.0 | 0.9 | 0.72 | — | — | — | — | — | — | — | — | " | 3.3 | 50 | 57 | " | Not Separated | 2.4 |
| 12 | 2.1 | 1.8 | 1.02 | — | — | — | — | — | — | — | — | " | 1.2 | 46 | 65 | " | Not Separated | 3.1 |
| 13 | 2.0 | 0.9 | 1.48 | — | — | — | — | — | — | — | — | " | 2.2 | 50 | 59 | " | Not Separated | 3.1 |
| 14 | 0.8 | 0.5 | 1.77 | — | — | — | — | — | — | — | — | " | 1.6 | 45 | 49 | " | Not Separated | 2.9 |
| 15 | 2.4 | 0.7 | 0.70 | 1.50 | — | — | — | — | — | — | — | " | 3.4 | 32 | 69 | " | Not Separated | 2.6 |
| 16 | 2.0 | 1.1 | 0.55 | — | 0.70 | — | — | — | — | — | — | " | 1.8 | 46 | 72 | " | Not Separated | 2.9 |
| 17 | 1.5 | 0.7 | 0.34 | — | — | 0.09 | — | — | — | — | — | " | 2.1 | 48 | 67 | " | Not Separated | 2.5 |
| 18 | 3.2 | 1.1 | 0.50 | — | 0.67 | 0.81 | — | — | — | — | — | " | 2.9 | 40 | 72 | " | Not Separated | 2.9 |
| 19 | 2.1 | 1.1 | 0.29 | 0.54 | 0.32 | 0.26 | — | — | — | — | — | " | 1.9 | 37 | 69 | " | Not Separated | 2.9 |
| 20 | 2.0 | 1.1 | 0.32 | — | — | — | 0.12 | — | — | — | — | " | 1.8 | 50 | 61 | " | Not Separated | 8.3 |
| 21 | 3.7 | 1.2 | 0.51 | — | — | — | — | 0.24 | — | — | — | " | 3.1 | 44 | 61 | " | Not Separated | 9.4 |
| 22 | 1.2 | 0.7 | 0.51 | — | — | — | — | — | 0.30 | — | — | " | 2.4 | 50 | 55 | " | Not Separated | 9.3 |
| 23 | 3.4 | 1.2 | 0.29 | — | — | — | — | — | — | 0.092 | — | " | 2.8 | 51 | 59 | " | Not Separated | 7.5 |
| 24 | 2.1 | 1.0 | 0.82 | — | — | — | 0.14 | 0.10 | 0.13 | 0.090 | — | " | 2.1 | 50 | 59 | " | Not Separated | 8.2 |
| 50 | — | — | — | 4.00 | — | — | — | — | — | — | 0.20 | " | — | 20 | 60 | " | Partly Separated | 2.5 |
| 51 | 9.0 | — | — | 2.3 | — | — | — | — | — | — | — | " | — | 12 | 56 | " | Partly Separated | 3.1 |
| 52 | 41.0 | — | — | — | Bal | — | — | — | — | — | — | — | — | 3 | 65 | " | Not Separated | 4.5 |

EXAMPLE 3

Alloy No. 6 (Table 1) and Alloy No. 13 (Table 2), after solder durability tests, were examined by taking photomicrographs of the cross-sections of soldered intermetallic compound layer consisting essentially of Ni, Ti, Sn and Cu was formed between the base metal and the $Cu_3Sn$ layer. On the other hand, in the case of Alloy No. 13 containing Zn, such a porous intermetallic compound layer was not formed. It may be presumed that the absence of such porous layer serves to prevent the peeling of a solder layer from the base metal or alloy substrate.

The present invention has been explained above by means of Examples, but it should be noted that the present invention is not limited thereto, and that any changes and modifications are possible as long as they are within the spirit and scope of the present invention which is defined by the claims.

What is claimed is:

1. A copper-base alloy for leadframes consisting essentially of 0.8–4.0 weight % of Ni, 0.2–4.0 weight % of Ti, 0.1–2.0 weight % of Zn, the essential balance being Cu and inevitable impurities, the ratio of Ni to Ti being 1–4.

2. The copper-base alloy for leadframes according to claim 1, further comprising 0.1–2.0 weight % of Sn.

3. The copper-base alloy for leadframes according to claim 1, further containing 0.01–2.0 weight % of at least one member selected from the group consisting of Fe and Co.

4. The copper-base alloy for leadframes according to claim 1, further containing 0.005–0.5 weight % of at least one element selected from the group consisting of Al, Si, Mn and Mg.

5. The copper-base alloy for leadframes according to claim 1, further containing 0.1–2.0 weight % of Sn and 0.01–2.0 weight % of at least one member selected from the group consisting of Fe and Co.

6. The copper-base alloy for leadframes according to claim 1, further containing 0.1–2.0 weight % of Sn and 0.005–0.5 weight % of at least one element selected from the group consisting of Al, Si, Mn and Mg.

7. The copper-base alloy for leadframes according to claim 3, further containing 0.005–0.5 weight % of at least one element selected from the group consisting of Al, Si, Mn and Mg.

8. The copper-base alloy for leadframes according to claim 5, further containing 0.005–0.5 weight % of at least one element selected from the group consisting of Al, Si, Mn and Mg.

* * * * *